(12) United States Patent
Komiyama et al.

(10) Patent No.: US 11,411,421 B2
(45) Date of Patent: *Aug. 9, 2022

(54) CONTROL DEVICE AND METHOD FOR CHARGING A RECHARGEABLE BATTERY

(71) Applicant: TOYOTA MOTOR EUROPE, Brussels (BE)

(72) Inventors: Keita Komiyama, Evere (BE); Yuki Katoh, Brussels (BE)

(73) Assignee: TOYOTA MOTOR EUROPE, Brussels (BE)

( * ) Notice: Subject to any disclaimer, the term of this patent is extended or adjusted under 35 U.S.C. 154(b) by 641 days.

This patent is subject to a terminal disclaimer.

(21) Appl. No.: 16/070,697

(22) PCT Filed: Feb. 2, 2016

(86) PCT No.: PCT/EP2016/052190
§ 371 (c)(1),
(2) Date: Jul. 17, 2018

(87) PCT Pub. No.: WO2017/133759
PCT Pub. Date: Aug. 10, 2017

(65) Prior Publication Data
US 2019/0023147 A1    Jan. 24, 2019

(51) Int. Cl.
*H02J 7/00* (2006.01)
*H01M 10/48* (2006.01)
(Continued)

(52) U.S. Cl.
CPC .......... *H02J 7/00712* (2020.01); *B60L 58/12* (2019.02); *B60L 58/13* (2019.02); *B60L 58/15* (2019.02);
(Continued)

(58) Field of Classification Search
CPC .................................................... H02J 7/0048
See application file for complete search history.

(56) References Cited

U.S. PATENT DOCUMENTS 3,657,639 A * 4/1972 Willihnganz ........ G01R 31/379
324/433
6,014,014 A * 1/2000 Owen .................... H01M 10/48
320/132
(Continued)

FOREIGN PATENT DOCUMENTS

EP     1 458 047 A2    9/2004
JP    2004-095400 A    3/2004
(Continued)

OTHER PUBLICATIONS

Oct. 24, 2016 International Search Report issued in International Patent Application No. PCT/EP2016/052190.
(Continued)

*Primary Examiner* — Drew A Dunn
*Assistant Examiner* — Tynese V McDaniel
(74) *Attorney, Agent, or Firm* — Oliff PLC (57) ABSTRACT

A control device for controlling charging of a rechargeable battery, the control device including a rechargeable dummy cell, a first circuit configured to charge the battery and the dummy cell, and a second circuit configured to measure the open circuit voltage of the dummy cell. The control device is configured to: determine the open circuit voltage of the dummy cell by using the second circuit, and determine the maximum capacity increment of the battery, which is to be charged until full charging, based on the determined open circuit voltage of the dummy cell. Also, a corresponding method of controlling charging of a rechargeable battery.

28 Claims, 4 Drawing Sheets

(51) Int. Cl.
*B60L 58/15* (2019.01)
*B60L 58/12* (2019.01)
*B60L 58/16* (2019.01)
*B60L 58/13* (2019.01)
*G01R 31/44* (2020.01)
*G01R 31/388* (2019.01)
*G01R 31/3835* (2019.01)

(52) U.S. Cl.
CPC ............ *B60L 58/16* (2019.02); *G01R 31/388* (2019.01); *G01R 31/3835* (2019.01); *G01R 31/44* (2013.01); *H01M 10/486* (2013.01); *H02J 7/005* (2020.01); *H02J 7/0021* (2013.01); *H02J 7/0029* (2013.01); *H02J 7/0047* (2013.01); *H02J 7/0049* (2020.01); *H02J 7/0063* (2013.01); *H02J 7/0077* (2013.01); *H02J 7/0085* (2013.01); *H02J 7/00716* (2020.01); *H01M 2220/20* (2013.01); *H02J 7/0048* (2020.01); *H02J 7/00302* (2020.01); *Y02T 10/70* (2013.01)

(56) References Cited

U.S. PATENT DOCUMENTS

| | | | | |
|---|---|---|---|---|
| 9,030,169 | B2* | 5/2015 | Christensen | G01R 31/378 320/132 |
| 10,673,103 | B2* | 6/2020 | Hoshina | H01M 4/505 |
| 2005/0001627 | A1* | 1/2005 | Anbuky | G01R 31/392 324/427 |
| 2006/0158155 | A1* | 7/2006 | Tamezane | G01R 31/367 320/132 |
| 2007/0166607 | A1* | 7/2007 | Okada | H01M 10/482 429/223 |
| 2013/0013238 | A1* | 1/2013 | Kawakita | B60L 58/12 702/63 |
| 2013/0022843 | A1* | 1/2013 | Tohda | H01M 4/587 429/50 |
| 2013/0252070 | A1* | 9/2013 | Reitzle | H01M 10/4285 429/178 |
| 2013/0294479 | A1* | 11/2013 | Ichikawa | G01K 17/04 374/109 |
| 2013/0297244 | A1* | 11/2013 | Takatsuji | G01R 31/392 702/63 |
| 2014/0088898 | A1* | 3/2014 | Lim | G01R 31/3835 702/63 |
| 2014/0177145 | A1* | 6/2014 | Kawahara | G01R 31/367 361/679.01 |
| 2014/0214347 | A1 | 7/2014 | Laskowsky et al. | |
| 2014/0239908 | A1* | 8/2014 | Ichikawa | H02J 7/0016 320/134 |
| 2014/0303914 | A1* | 10/2014 | Sejima | G01R 31/3842 702/63 |
| 2014/0327306 | A1* | 11/2014 | Inoue | H02J 7/0029 307/23 |
| 2015/0236525 | A1* | 8/2015 | Aridome | H02J 7/007194 320/107 |
| 2015/0288209 | A1* | 10/2015 | Rippel | H02J 7/0063 320/107 |
| 2015/0369869 | A1 | 12/2015 | Tsuzuku et al. | |
| 2015/0369871 | A1* | 12/2015 | Nishigaki | G01R 31/3648 324/426 |
| 2016/0025812 | A1* | 1/2016 | Bourilkov | G01R 31/3646 324/435 |
| 2016/0218521 | A1* | 7/2016 | Huang | H02J 2207/40 |
| 2016/0268651 | A1* | 9/2016 | Arai | H01M 10/482 |
| 2016/0372940 | A1* | 12/2016 | Canadi | H02J 7/1461 |
| 2017/0108554 | A1* | 4/2017 | Bourilkov | G01R 19/16576 |
| 2017/0365886 | A1* | 12/2017 | Hoshina | H01M 10/4257 |
| 2019/0020209 | A1* | 1/2019 | Komiyama | G01R 31/392 |
| 2019/0044345 | A1* | 2/2019 | Komiyama | H02J 7/007182 |
| 2019/0181652 | A1* | 6/2019 | Komiyama | B60L 58/10 |
| 2019/0198940 | A1* | 6/2019 | Komiyama | H01M 10/445 |

FOREIGN PATENT DOCUMENTS

| | | | |
|---|---|---|---|
| JP | 2007-220658 A | 8/2007 | |
| JP | 2010-273413 A | 12/2010 | |
| JP | 2012-054019 A | 3/2012 | |
| JP | 2015-158416 A | 9/2015 | |
| WO | 2014/111784 A1 | 7/2014 | |
| WO | WO-2014111784 A1 * | 7/2014 | ........ H02J 7/007194 |
| WO | 2015/011534 A2 | 1/2015 | |

OTHER PUBLICATIONS

English-language translation of Oct. 29, 2019 Office Action issued in Japanese Patent Application No. 2018-558476.

* cited by examiner

CONTROL DEVICE AND METHOD FOR CHARGING A RECHARGEABLE BATTERY

FIELD OF THE DISCLOSURE

The present disclosure is related to a control device for controlling charging of a rechargeable battery and also to a method of charging of a rechargeable battery.

BACKGROUND OF THE DISCLOSURE

Rechargeable batteries, also called secondary cells, have become increasingly important as energy storages, in particular for vehicles. Such vehicles may be hybrid vehicles comprising an internal combustion engine and one or more electric motors or purely electrically driven vehicles.

A suitable rechargeable battery for such a vehicle may be a solid-state bipolar battery or other, e.g. liquid type batteries, in particular a laminated Li-ion battery. The rechargeable battery may be realized by a single cell or it may include a set of preferably identical cells. In the latter case the battery is also called a battery pack.

A relevant characteristic of a battery is its capacity. A battery's capacity is the amount of electric charge it can deliver at a rated voltage. The more electrode material contained in the battery the greater is its capacity. The capacity is measured in units such as amp-hour (A·h).

The battery or the battery pack may include a control device for controlling charging and/or discharging. The control device monitors state of charge (SOC) of the battery and it shall avoid the battery from operating outside its safe operating area. Such a battery or battery pack is also called smart battery/smart battery pack. It is also possible that the control device is provided by the vehicle.

One important aspect of charge control is to assure that any overcharging and/or over-discharging of the battery is avoided. For this purpose the battery voltage may be monitored, which is increasing during charging. In case the determined battery voltage exceeds a predetermined upper voltage limit, it is recognized by the control device that the battery is fully charged and charging is stopped.

However, during the lifetime of a battery the charging and discharging procedures may lead to a degradation of the laminated layers of the battery. In particular the laminated electrodes may be affected by the degradation. The degradation leads to increased resistance which in turn increases the measured voltage of the battery during charging.

As a result, when charging a battery with lamination degradation, the measured voltage reaches the predetermined upper voltage limit sooner, and the control device erroneously recognizes that the battery is fully charged. Although the battery is actually not yet fully charged (not SOC100%), charging is finished. This means that the available amount of energy decreases due to the degradation dispersion.

EP 1 458 047 A2 discloses a charge control system for preventing overcharge of single cell layers. For this purpose one of the positive and the negative electrode active material layer of the battery is made of a changeable electrode active material, and the other is made of an unchangeable electrode active material. The changeable electrode active material is an active material having a specific characteristic based on which the charging is controlled.

However, in the above technology only limited materials can be applied to the electrode layers of the battery. Moreover, the system may not be able to compensate a large degradation.

SUMMARY OF THE DISCLOSURE

Currently, it remains desirable to provide a control device which provides a reliable charging control function and which is suitable for different battery types.

Therefore, according to embodiments of the present disclosure, a control device is provided for controlling charging of a rechargeable battery. The control device comprises:
- a rechargeable dummy cell,
- a first circuit configured to charge the battery and the dummy cell, and
- a second circuit configured to measure the open circuit voltage of the dummy cell.

The control device is configured to:
- determine the open circuit voltage of the dummy cell by using the second circuit, and
- determine the maximum capacity increment of the battery based on the determined open circuit voltage of the dummy cell.

By providing such a configuration it is possible to control charging based on capacity monitoring of the battery. For this purpose a dummy cell is used which is configured such that it permits determining a maximum capacity increment of the battery. Said maximum capacity increment of the battery is preferably the maximum chargeable capacity increment. More particularly, the maximum capacity increment is preferably that amount of capacity, which still remains to be charged until the battery is fully charged, advantageously until its state of charge (SOC) reaches 100%.

The dummy cell allows measuring the open circuit voltage more precisely than it could be done at the battery. Hence, also the maximum capacity increment of the battery can be determined more precisely. The dummy cell may consist of one single secondary (i.e. rechargeable) cell. It may be included in the battery (in particular if the battery is realized as a battery pack comprising a plurality of cells). Basically, the design parameters (as e.g. the cell capacity, the degradation rate or the cell type, etc.) may be same between the dummy cell and the battery. In particular, in case the battery is realized as a battery pack comprising a plurality of cells, the dummy cell may be of the same type as such a cell of the battery. The dummy cell may be configured only for supporting controlling charging of the rechargeable battery but not for driving the vehicle, in particular with regard to its stored electrical power. However, it may be charged and discharged in correspondence to the battery.

The capacity of a battery is the amount of electric charge it can deliver at a rated voltage. The capacity is measured in units such as amp-hour (A·h). The maximum capacity increment of the battery according to the disclosure represents the amount of electric charge which has to be charged, when charging is started. Hence, in case the state of charge SOC is e.g. 30% when charging is started, the maximum capacity increment of the battery corresponds to 70%. The maximum capacity increment of the battery may also be referred to as the Depth of Discharge (DOD) of the battery, which is the complement of SOC: as the one increases, the other decreases. The DOD may also be expressed in Ah.

The open circuit voltage is the difference of electrical potential between two terminals of a device, i.e. between the two terminals of the dummy cell, when disconnected from any circuit, in particular the first circuit according to the disclosure. Hence, there is no external load connected, such that no external electric current flows between the terminals.

The control device and the procedure performed by the control device are suitable for all types of solid-state bipolar batteries. However, the control device may also be applied to other battery types, like liquid type batteries, as e.g. Li-ion battery.

The control device may further be configured to:
charge the battery and the dummy cell by using the first circuit,
monitor the current capacity increment of the battery which has been charged, and
stop charging, when the current capacity increment of the battery exceeds the determined maximum capacity increment.

Accordingly, the control device is able to reliably charge the battery based on the determined maximum capacity increment, until the battery is fully charged.

The control device may further be configured to determine, whether the battery is discharged during charging. If this is the case, the control device is preferably further configured to re-determine the open circuit voltage of the dummy cell by using the second circuit and to re-determine the maximum capacity increment of the battery based on the re-determined open circuit voltage.

In this way the control device may be configured to consider a discharging of the battery which may happen at the same time, as the battery is charged. For instance, when the vehicle is driven by the electric motor which is fed by the battery, the battery is discharged. In case the vehicle is a hybrid vehicle, the battery may be charged at the same time by the electric power generated by the internal combustion engine. The control device may be configured to control charging and/or discharging of the battery.

The control device may further be configured to determine the current capacity increment of the battery based on the charging current and charging time of the battery, and/or based on the open circuit voltage of the dummy cell.

In other words, by integrating the current over time, the capacity of the battery may be calculated. Alternatively or additionally the capacity may be determined based on the open circuit voltage of the dummy cell. The current capacity increment may be measured while the battery is charging provided that the measurement is based on the charging current and charging time of the battery. In case the system uses measuring the voltage of the dummy cell during charging, the charging may stop shortly in order to measure the current capacity increment.

The control device may be configured determine the state of charge of the dummy cell based on the determined open circuit voltage of the dummy cell, and in particular based on a predetermined SOC-OCV mapping. Hence, the control device may be provided with a predetermined SOC-OCV mapping, e.g. a SOC-OCV curve, in which it may look up the SOC value, which corresponds to the measured OCV value.

The control device may be configured determine the maximum capacity increment based on the determined state of charge of the dummy cell. In other words, the maximum capacity increment of the battery may be determined based on the determined state of charge of the dummy cell, which itself has been determined based on the determined open circuit voltage of the dummy cell.

The predetermined SOC-OCV mapping may be updated based on a determined degradation of the dummy cell. Accordingly, said SOC-OCV mapping may be predetermined before the first charging of the dummy cell. It may further be updated during the charging procedures. Consequently, the maximum capacity increment of the battery may be determined based on the determined open circuit voltage of the dummy cell and the degradation of the of the dummy cell.

The degradation of the dummy cell may be determined based on a temperature/frequency distribution of the dummy cell and a predetermined degradation rate of the dummy cell.

The determination of the degradation of the dummy cell may be based on the Arrhenius equation.

The temperature/frequency distribution of the dummy cell may be determined by recording for each temperature of the dummy cell how much time the dummy cell had this temperature during its lifetime.

In other words, the temperature data of the dummy cell may be collected during the life time of the dummy cell, i.e. during its usage and the rests between usages. The temperature/frequency distribution may be established by accumulating for each temperature the dummy cell had during its past life time, how long the dummy cell had this temperature. For this reason it is advantageous that the dummy cell has the same age, i.e. lifetime, like the battery. In other words, the dummy cell is advantageously replaced, when the battery is replaced.

The control device may further be configured to determine the state of charge of the battery based on the determined state of charge of the dummy cell and in particular based on a predetermined mapping between the state of charge of the battery and the state of charge of the dummy cell. For example the control device may look-up in a predetermined look-up table, i.e. the predetermined mapping, the state of charge of the battery which matches to the determined state of charge of the dummy cell. In other words the relationship between the state of charge of the battery and the determined state of charge of the dummy cell may be predetermined and may hence be known to the control device. In one example, the dummy cell may continuously have a state of charge which corresponds to that one of the battery.

The control device may moreover be configured to determine the maximum capacity increment based on the state of charge of the battery. Hence, the relationship between the maximum capacity increment and the determined state of charge of the battery may be calculated by the control device. In other words, the maximum capacity increment of the battery may be determined based on the determined state of charge of the battery, which itself has been determined based on the determined state of charge of the dummy cell, which itself has been determined based on the determined open circuit voltage of the dummy cell and the determined degradation of the dummy cell.

The control device may be configured to control charging of a battery of a specific battery type comprising a predetermined degradation rate, wherein the dummy cell may have a degradation rate which correlates with the degradation rate of the battery, and which in particular may be the same degradation rate. Accordingly, the dummy cell may also be a rechargeable battery. The dummy cell is preferably chosen such that, based on its measured characteristics, the characteristics of the battery can be determined. In particular, the dummy cell is chosen such that, based on its determined degradation rate, the degradation rate of the battery and hence also a suitable maximum capacity increment of the battery can be determined.

Moreover, the battery of the specific battery type preferably comprises a predetermined capacity, wherein the dummy cell may have a capacity which correlates with the capacity of the battery. For example, in case the battery is a battery pack comprising a plurality of cells, the dummy cell may have the same capacity as such a cell. Furthermore, the dummy cell may be of the same type as such a dummy cell. Accordingly, the dummy cell is chosen such that, based on its state of charge, the state of charge of the battery and hence also a suitable maximum capacity increment of the battery can be determined. For example, if the vehicle uses the battery between SOC20% and SOC80%, the dummy cell may have the capacity which is equivalent to this range, i.e. may also have a range between SOC20% and SOC80%.

Preferably, the control device may comprise a voltage sensor for detecting the open circuit voltage of the dummy cell. The control device may comprise a further voltage sensor for detecting the voltage and/or the state of charge of the battery.

The control device may comprise a temperature sensor for detecting the temperature of the dummy cell and/or the battery.

The disclosure further relates to a battery pack. The battery pack may comprise at least one battery, in particular a solid state bipolar battery, and a control device as described above.

The disclosure further relates to a battery charging system. Said battery charging system may comprise at least one battery, in particular a solid state bipolar battery, a charging device for the battery, and a control device as described above.

According to a further aspect the disclosure relates to a vehicle comprising an electric motor and a battery pack, as described above.

Alternatively the vehicle may comprise an electric motor, at least one battery, in particular a solid state bipolar battery, and in addition a control device, as described above.

Moreover the disclosure relates to a method of controlling charging of a rechargeable battery. A first circuit is used to charge the battery and a rechargeable dummy cell, and a second circuit is used to measure the open circuit voltage of the dummy cell. The method comprises the steps of:
  determining the open circuit voltage of the dummy cell by using the second circuit, and
  determining the maximum capacity increment of the battery based on the determined open circuit voltage of the dummy cell.

The method may further comprise the steps of:
charging the battery and the dummy cell by using the first circuit,
  monitoring the current capacity increment of the battery which has been charged, and
  stopping charging, when the current capacity increment of the battery exceeds the determined maximum capacity increment.

The method may further comprise the steps of: determining, whether the battery is discharged during charging, and if yes, re-determining the open circuit voltage of the dummy cell and the maximum capacity increment of the battery.

The current capacity increment of the battery may be determined based on the charging current and charging time of the battery, and/or based on the voltage of the dummy cell during charging.

The state of charge of the dummy cell may be determined based on the determined open circuit voltage of the dummy cell, and in particular based on a predetermined SOC-OCV mapping.

The maximum capacity increment may be determined based on the determined state of charge of the dummy cell.

The predetermined SOC-OCV mapping is preferably updated based on a determined degradation of the dummy cell.

The degradation of the battery may be determined based on a temperature/frequency distribution of the dummy cell and a predetermined degradation rate of the dummy cell.

The determination of the degradation of the dummy cell may be based on the Arrhenius equation.

The temperature/frequency distribution of the dummy cell may be determined by recording for each temperature of the dummy cell how much time the dummy cell had this temperature during its lifetime.

The state of charge of the battery may be determined based on the determined state of charge of the dummy cell and in particular based on a predetermined mapping between the state of charge of the battery and the state of charge of the dummy cell. The maximum capacity increment may be determined based on the state of charge of the battery.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
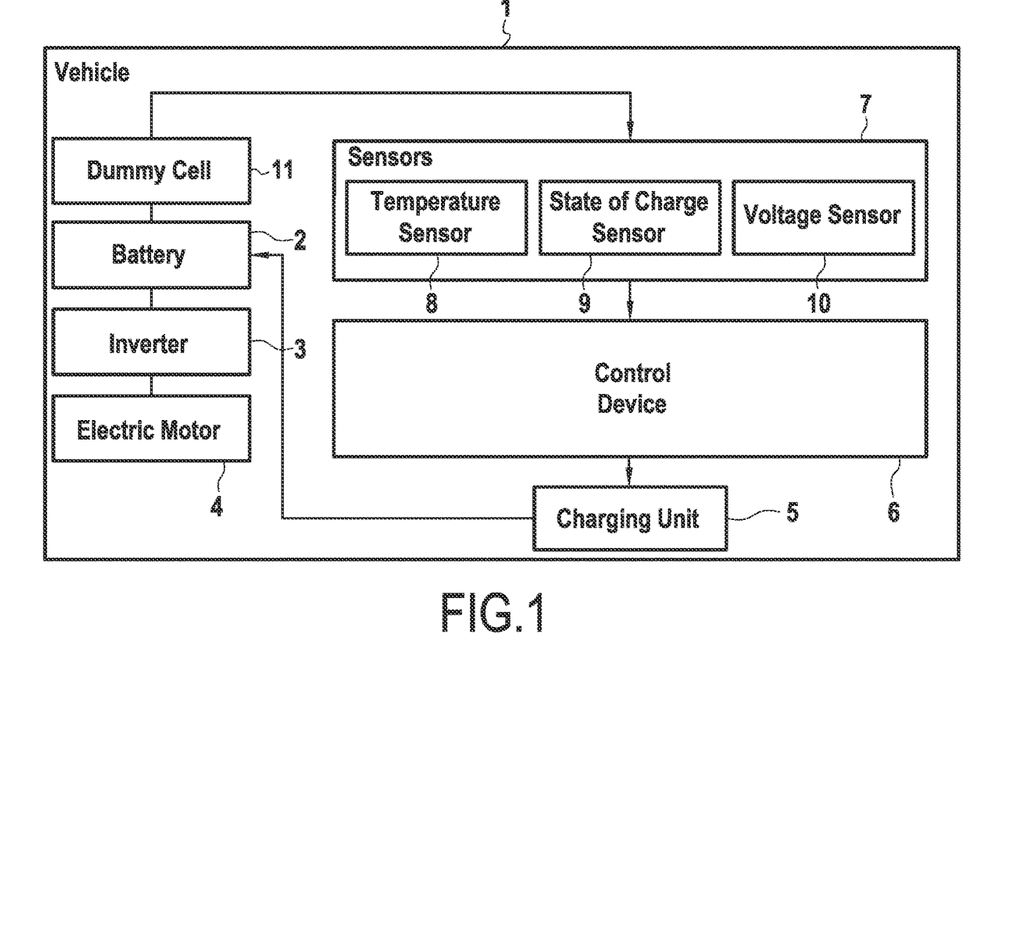
FIG. 1 shows a schematic representation of a vehicle comprising a control device according to an embodiment of the present disclosure.

FIG. 1 shows a schematic representation of a vehicle 1 comprising a control device 6 according to an embodiment of the present disclosure. The vehicle 1 may be a hybrid vehicle or an electric vehicle (i.e. a purely electrically driven vehicle). The vehicle 1 comprises at least one electric motor 4, which is powered by a battery or battery pack 2, preferably via an inverter 3. In case the vehicle is a hybrid vehicle, it further includes an internal combustion engine. The battery 2 may be a solid-state bipolar battery. However, it may also be another battery type, like a liquid type battery, as e.g. a Li-ion battery.

The battery 2 is connected to a charging unit 5 which is configured to charge the battery 2. For this purpose the charging unit 5 may comprise an electric control circuit, as e.g. a power electronics circuit. The charging unit may further comprise or be connected to a connector for external charging by an external power source. The connector may be e.g. a plug or a wireless connector system. In case the vehicle is a hybrid vehicle, the charging unit may further be connected to the electrical generator of the internal combustion engine of the vehicle. Consequently, the battery 2 may be charged, when the internal combustion engine is operating and/or when the vehicle is connected to an external power source. Furthermore the battery 2 may be discharged, in order to operate the vehicle 1, in particular the electric motor 4. The battery 2 may further be discharged in a battery treatment and/or recovery procedure.

The vehicle further comprises a dummy cell 11 which is configured to provide information, in particular measurements, based on which the charging of the battery 2 is controlled. This will be described in more detail below. The dummy cell 11 may be a further rechargeable battery, preferably of the same type as the battery 2. It may be integrated into the vehicle, e.g. it may be integrated with the control device 6. Alternatively it may be integrated with the battery 2. In the latter case the dummy cell 11 can be easily replaced together with the battery 2. For example, the battery may be realized as a battery pack comprising a plurality of cells, wherein the dummy cell is realized as a cell of the same type and may be included in the battery pack.

In order to control charging and discharging the vehicle 2 is provided with the control device 6 and sensors 7. For this purpose the control device 6 monitors the battery 2 and/or the dummy cell 2 via the sensors 7 and controls the charging unit 5. The control device 6 and/or the sensors 7 may also be comprised by the battery 2. The control device may be an electronic control circuit (ECU). It may also comprise a data storage. It is also possible that the vehicle comprises a smart battery charging system with a smart battery and a smart charging device. In other words, both the battery and the vehicle may comprise each an ECU which operate together and form together the control device according to the disclosure. In the latter case the dummy cell 11 may be integrated in the smart battery. Furthermore the control device 6 may comprise or may be part of a battery management system.

The control device 6 may comprise an application specific integrated circuit (ASIC), an electronic circuit, a processor (shared, dedicated, or group), a combinational logic circuit, a memory that executes one or more software programs, and/or other suitable components that provide the described functionality of the control device 6.

As it will be explained in more detail in the following, the sensors 7 comprise in particular a voltage sensor 10 for measuring the open circuit voltage (OCV) of the dummy cell 11. Moreover the sensors 7 may comprise one or more temperature sensors 8 for measuring the temperature of the battery 2 and/or the dummy cell 11, at least one SOC (state of charge) sensor 9 for measuring the state of charge of the battery 2 and/or the dummy cell 11 and at least one further voltage sensor 10 for measuring the voltage of the battery 2 and/or the dummy cell 11. The SOC sensor 9 may also be a voltage sensor, wherein the measured voltage is used to determine the SOC of the battery. Of course, the SOC sensor 9 may also comprise other sensor types to determine the SOC of the battery, as it is well known in the art.

Figure 2:
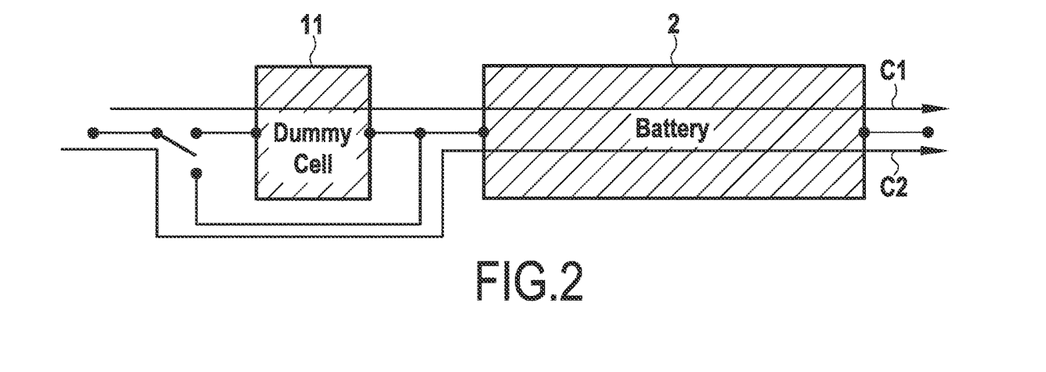
FIG. 2 shows a schematic representation of the electric circuits of the control device according to an embodiment of the present disclosure.

FIG. 2 shows a schematic representation of the electric circuits of the control device according to an embodiment of the present disclosure. The dummy cell 11 and the battery 2 are connected to a first electrical circuit C1, for example in series. This circuit C1 is configured to charge both the dummy cell 2 and the battery 2. Preferably the circuit C1 is also configured to discharge both the dummy cell 2 and the battery 2. A second circuit C2 is configured to measure the open circuit voltage $OCV_d$ of the dummy cell. In order to switch between the circuits C1 and C2, there may be provided a switch, which can be controlled by the control device 6. It is noted that FIG. 2 is a simplified diagram of the electric circuits of the control device.

Figure 3:
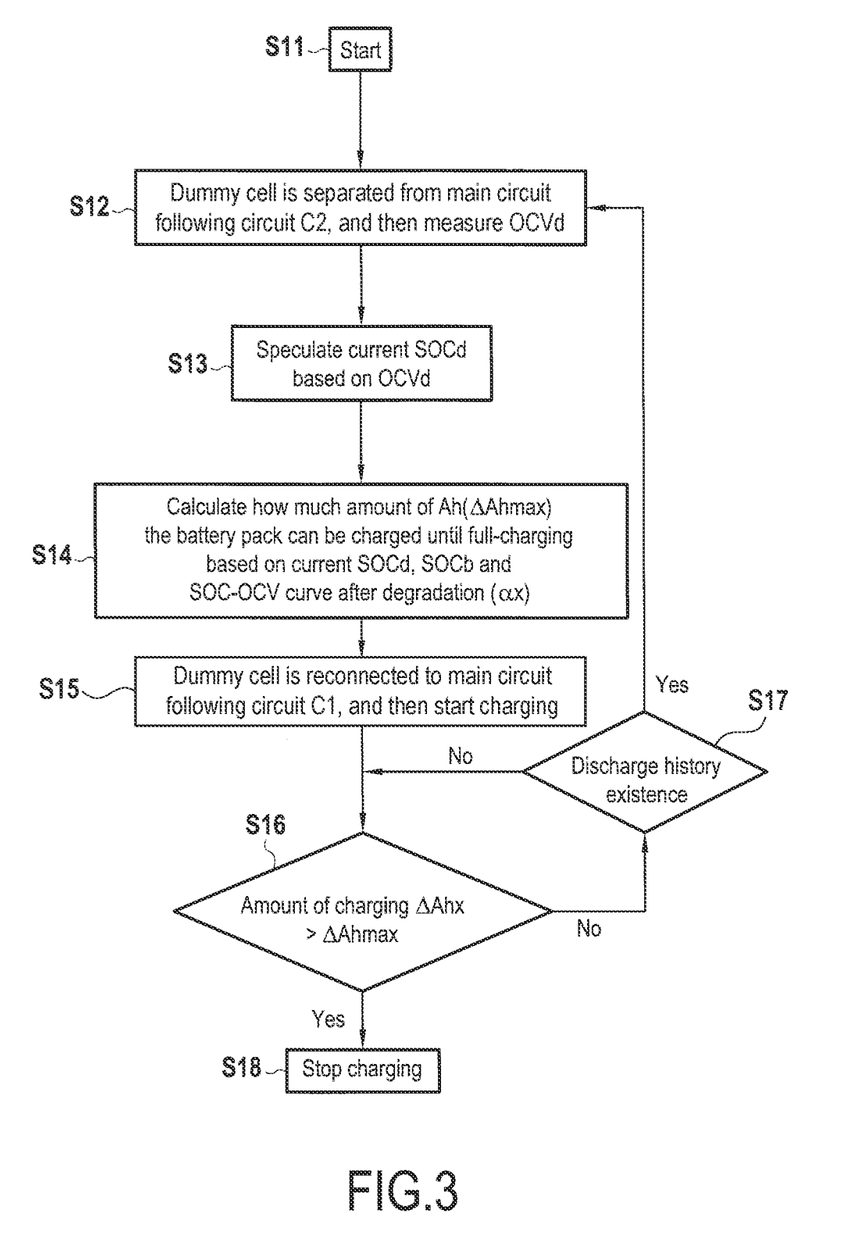
FIG. 3 shows a flow chart of the general charging control procedure according to an embodiment of the present disclosure.

FIG. 3 shows a flow chart of the general charging control procedure according to an embodiment of the present disclosure. The control device 6 is configured to carry out this procedure of FIG. 3.

In step S11 the procedure is started. The start may be triggered by a determination of the control device that charging of the battery is necessary (e.g. due to a low SOC) and/or by the fact that charging becomes possible (e.g. due to operation of the internal combustion engine or due to a connection to an external electrical power source).

In step S12 the dummy cell 11 is separated from the main charging circuit C1. In other words the control device will switch to circuit C2, in which the dummy cell 11 is separated from the circuit C1. Subsequently the open circuit voltage $OCV_d$ of the dummy cell is measured.

In step S13 the current state of charge $SOC_d$ of the dummy cell is determined based on the measured open circuit voltage of the dummy cell 11. Since this determination of $SOC_d$ may not be exact, it may also be referred to as a speculated value. In addition, the state of charge $SOC_d$ of the dummy cell is determined based the determined degradation of the dummy cell, as it will be explained in detail in context of FIG. 4.

In step S14 the maximum capacity increment $\Delta Ah_{max}$ of the battery is determined, basically based on the open circuit voltage $OCV_d$ of dummy cell and advantageously the determined degradation $\alpha_x$ of the dummy cell. The determined degradation $\alpha_x$ of the dummy cell preferably corresponds to that one of the battery or has a known relationship to that one of the battery.

In particular, the maximum capacity increment $\Delta Ah_{max}$ of the battery may be determined based on the determined state of charge $SOC_d$ of the dummy cell 11, which is determined in step S13 based on the open circuit voltage and the degradation of the dummy cell. In addition, the maximum capacity increment $\Delta Ah_{max}$ of the battery 2 may be determined based on a predetermined SOC-OCV mapping by identifying in the $SOC_d$ value which matches to the measured $OCV_d$ value. The SOC-OCV mapping may be regularly updated based on the determined degradation $\alpha_x$ of the dummy cell, as it will be explained in detail in context of FIG. 4. The SOC-OCV mapping may be represented by a SOC-OCV curve, as shown in FIG. 5.

More particularly, the maximum capacity increment $\Delta Ah_{max}$ of the battery may be determined based on the state of charge $SOC_b$ of the battery, which itself is determined based on the state of charge $SOC_d$ of the dummy cell. In order to do so, a predetermined mapping may be used which indicates the relationship between the $SOC_d$ of the dummy cell 11 (as determined in step S13) and the $SOC_b$ of the battery. For example, the maximum capacity increment $\Delta Ah_{max}$ of the battery may be calculated based on the difference between 100% SOC (determined based on the current degradation $\alpha_x$) and the determined current $SOC_b$ (determined based on the current degradation $\alpha_x$), i.e.

$$\Delta Ah_{max} = SOC100\%(\alpha_x) - SOC_b(\alpha_x)$$

The procedure of steps S13 to S14 preferably only takes a limited time, as e.g. 0.02 s, 0.05 s, 0.1 s, 0.2 s or 1 s.

In step S15 the charging is started. This is done by switching to circuit C1.

In step S16 it is determined, whether the current capacity increment $\Delta Ah_x$ of the battery exceeds the determined maximum capacity increment $\Delta Ah_{max}$. The battery 2 is hence charged, as long as the current capacity increment $\Delta Ah_x$ of the battery does not exceed the determined maximum capacity increment $\Delta Ah_{max}$. Otherwise the charging procedure is completed and finally stopped in step S18.

For this purpose, the current capacity increment $\Delta Ah_x$ of the battery is monitored in step S16. Said current capacity increment $\Delta Ah_x$ of the battery may be determined based on the monitored charging current $I_x$ and the charging time of the battery, in particular based on the measured charging current $I_x$ integrated over the charging time. Additionally or alternatively the current capacity increment $\Delta Ah_x$ of the battery may be determined based on a previously measured open circuit voltage of the dummy cell.

Moreover it is determined in step S17, whether the battery is at the same time discharged during charging. This might be due to a consumption of electrical power stored in the battery, e.g. due to a use of the electrical motor of the vehicle. Preferably the dummy cell is configured such that it is also discharged, when the battery is discharged. This may be realized by circuit C1. In this way, it is possible that the dummy cell has always a state of charge which corresponds to that one of the battery.

The determination in step S17 is preferably done regularly, e.g. every 1 s, 5 s, 20 s or 1 min. In case the battery is not discharged the method returns to step S16. In other words, during charging the method runs a short loop between steps S16 and step S17.

In case it is determined in step S17 that the battery is at the same time discharged during charging, the method returns to step S12. In other words, in this case of detected discharging the methods runs a long loop between steps S12 and step S17. In this way the method may again determine the maximum capacity increment $\Delta Ah_{max}$ in step S14, as described above. By doing so the method is advantageously able to determine how much amount of capacity has been discharged since the last time the maximum capacity increment $\Delta Ah_{max}$ has been determined in step S14. Moreover it is possible to consider any further degradation of the battery, which has occurred in the meantime. Hence, the maximum capacity increment $\Delta Ah_{max}$ may be determined again, thereby considering this further degradation.

Figure 4:
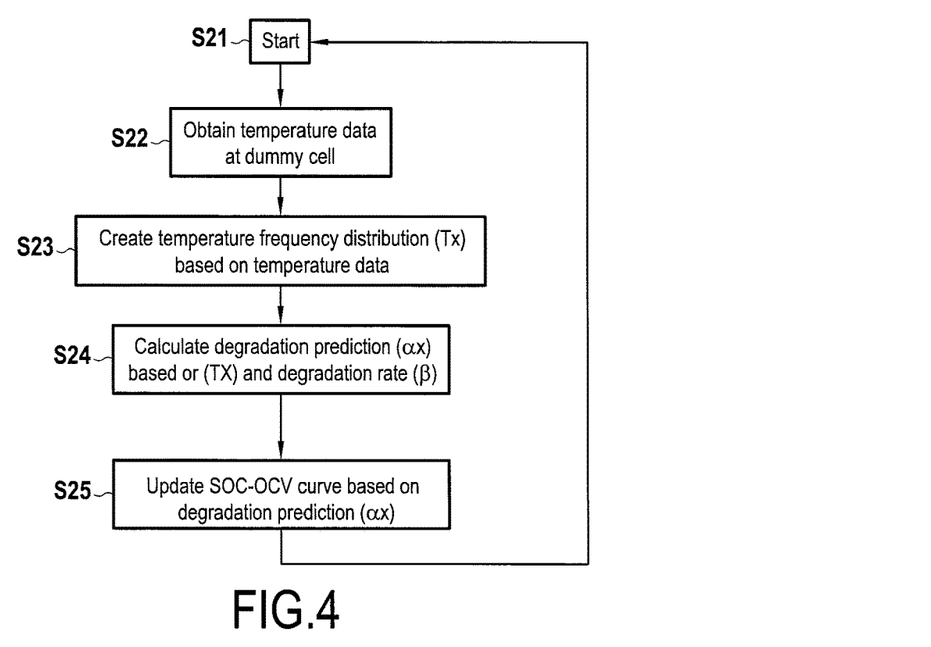
FIG. 4 shows a flow chart of the procedure for updating a SOC-OCV curve according to an embodiment of the present disclosure.
Figure 5:
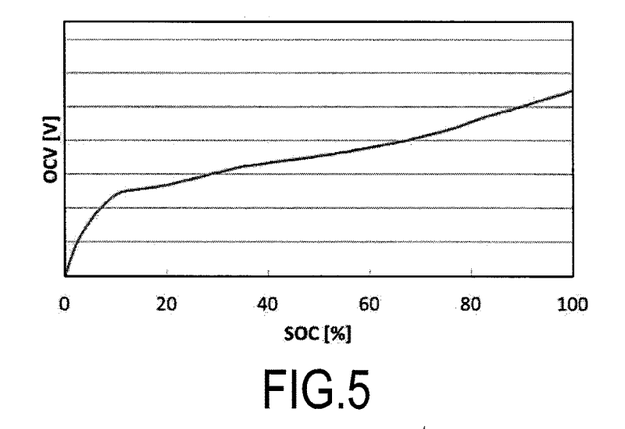
FIG. 5 shows an exemplary and schematic diagram of a SOC-OCV curve.

FIG. 4 shows a flow chart of the procedure for updating a SOC-OCV curve (i.e. a SOC-OCV mapping) according to an embodiment of the present disclosure. An exemplary and schematic diagram of a SOC-OCV curve is shown in FIG. 5.

The procedure of FIG. 4 is preferably carried out in step S13 of the procedure of FIG. 3 so that the SOC-OCV curve and hence the maximum capacity increment $\Delta Ah_{max}$ is always determined based on a currently updated degradation $\alpha_x$. It is noted that the determined degradation $\alpha_x$ rather represents an estimation of the actual degradation of the battery.

In step S22 temperature data of the dummy cell are obtained. For this purpose the temperature sensor 8 may be used. However, these data may include not only the current temperature of the dummy cell, but also historic temperature data since the last time the procedure of FIG. 4 has been carried out, in particular since the last time the temperature frequency distribution $T_x$ has been updated (cf. step S23).

In step S23 the temperature frequency distribution $T_x$ is established or, in case a temperature frequency distribution $T_x$ already exists, it is updated. For this purpose the collected temperature data obtained in step S22 are accumulated, wherein the accumulated time for each measured temperature is expressed as its inverse, i.e. as frequency. The temperature frequency distribution $T_x$ is described in more detail below in context of FIG. 7.

In step S24 the degradation $\alpha_x$ of the dummy cell is determined based on the temperature frequency distribution $T_x$ and the predetermined dummy cell specific degradation rate $\beta$, which preferably corresponds, in particular is equal, to the battery-type specific degradation rate $\beta$. This determination, i.e. calculation, is described in the following with reference to FIGS. 6 and 7.

Figure 6:
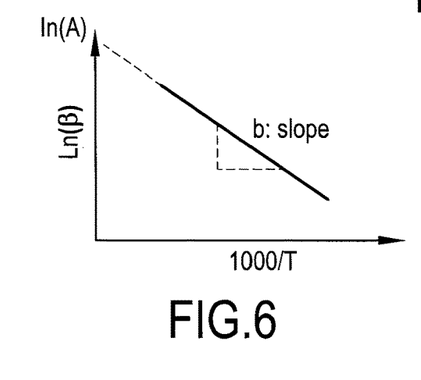
FIG. 6 shows an exemplary and schematic diagram of a predetermined degradation rate in relation to the temperature of a dummy cell.
Figure 7:
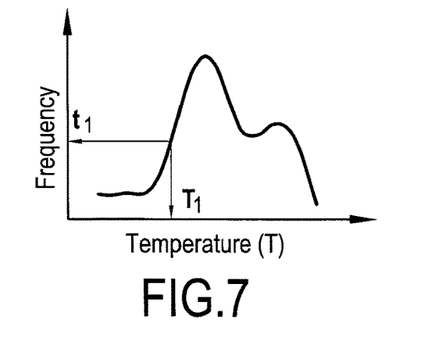
FIG. 7 shows an exemplary and schematic diagram of a determined temperature/frequency distribution of a dummy cell.

Basically the calculation of the degradation $\alpha_x$ is based on the Arrhenius equation, as generally known in the art. The degradation $\alpha_x$ is calculated by $$\alpha x = c \times \exp\left(\frac{b}{T}\right) \times t$$

wherein:
t=time
c=ln(A)
b=−(E/R)
T=Temperature

The current degradation $\alpha_x$ is thereby an accumulated value, i.e. the currently calculated degradation and the sum of all formerly calculated degradations, as e.g.

$$\alpha x1 = \alpha_1 + \alpha_2 + \alpha_3 \ldots$$

with:

$$\alpha_1 = c \times \exp\left(\frac{b}{T_1}\right) \times t_1$$

The values for the temperature T and for the time t can thereby be derived from the temperature frequency distribution $T_x$ as shown in FIG. 7. The further parameters c and b are predetermined in context of the determination of the degradation rate $\beta$.

The degradation rate $\beta$ is calculated based on the equation:

$$k = A\exp\left(-\frac{E_a}{RT}\right)$$

wherein:
k=predetermined reaction rate constant (or rate constant)
A=constant
$E_a$=activation energy
R=gas constant
T=Temperature The parameters k, A, Ea and R are known by pre-experiment of the specific type of the used dummy cell, which preferably corresponds to the type of the battery, or are generally known parameters.

When k⇒β:

$$\ln(\beta) = \ln(A) - \left(\frac{E}{R}\right) \times \frac{1}{T}$$

Accordingly, the parameters b and c for the calculation of degradation $\alpha_x$ can be determined by:
b=−(E/R)
c=ln(A)
The resulting diagram of the degradation rate β is shown in FIG. 6. The degradation rate β is predetermined and specific for the type of the used dummy cell, which preferably corresponds to the type of the battery. The degradation rate β is preferably determined in pre-experiment and is known by the battery (in case of a smart battery) and/or by the control device.

The $SOC_b$ of the battery may be mapped to the $SOC_d$ of the dummy cell, which itself is mapped (e.g. by way of the SOC-OCV mapping) to the determined degradation $\alpha_x$ in a look-up map, i.e.:

$\alpha_{x1} \Rightarrow SOC_{d1} \Rightarrow SOC_{b1}$ $\alpha_{x2} \Rightarrow SOC_{d2} \Rightarrow SOC_{b2}$ $\alpha_{x3} \Rightarrow SOC_{d3} \Rightarrow SOC_{b3}$ $\alpha_{x4} \Rightarrow SOC_{d4} \Rightarrow SOC_{b4}$ etc.

This relation between $SOC_d$ and αx and/or between $SOC_b$ and $SOC_d$ is preferably determined in a pre-experiment and is specific for the battery-type of the used dummy cell, which preferably corresponds to the battery-type of the battery 2. The look-up map may be stored in a data storage of the control-device or of the battery (in case of a smart battery).

FIG. 5 shows an exemplary and schematic diagram of a SOC-OCV curve. As it can be seen, the OCV values are successively increasing with increasing SOC, in particular in the region of SOC>30%. Hence, at least in said region for each OCV value a unique SOC value can be determined from the SOC-OCV curve. The SOC-OCV curve is preferably predetermined in experiments before the battery is used. During the lifetime of the battery the battery SOC-OCV curve is continuously updated, at least once per charging procedure described in context of FIG. 3.

FIG. 6 shows an exemplary and schematic diagram of a predetermined degradation rate in relation to the temperature of a dummy cell. As it can be seen the values of the parameters b and c can be directly derived from this diagram, as b is the slope of the linear function and c is the intercept of the (elongated) linear function with the Y-axis.

FIG. 7 shows an exemplary and schematic diagram of a determined temperature/frequency distribution of a dummy cell. In the diagram the x-axis represents the temperature T of the dummy cell and the y-axis represents the frequency, i.e. the inverse of the time. The diagram contains the accumulated temperature data of the dummy cell over its whole life time, i.e. over the whole time the dummy cell has been used and the rest times between the usages. In order to establish the diagram, i.e. the illustrated curve, it is determined for each temperature the dummy cell had during its life time, e.g. from −40° C. to +60° C. in (quantized) steps of 1° C., how much time the dummy cell had each of these temperatures. The accumulated time is thereby expressed by its inverse, i.e. by a frequency. Preferably, the life time of the dummy cell corresponds to that one of the battery 2. The temperature of the dummy cell should approximately correspond to that one of the battery, so that their degradation is the same. Accordingly, the dummy cell may be positioned close to the battery. Also both the dummy cell and the battery may be positioned in a case of a battery pack. This case may be equipped with a cooling fan and/or means for stabilizing the temperature of the dummy cell and the battery. Thereby, the temperature of the dummy cell and the battery can become equal.

Figure 8:
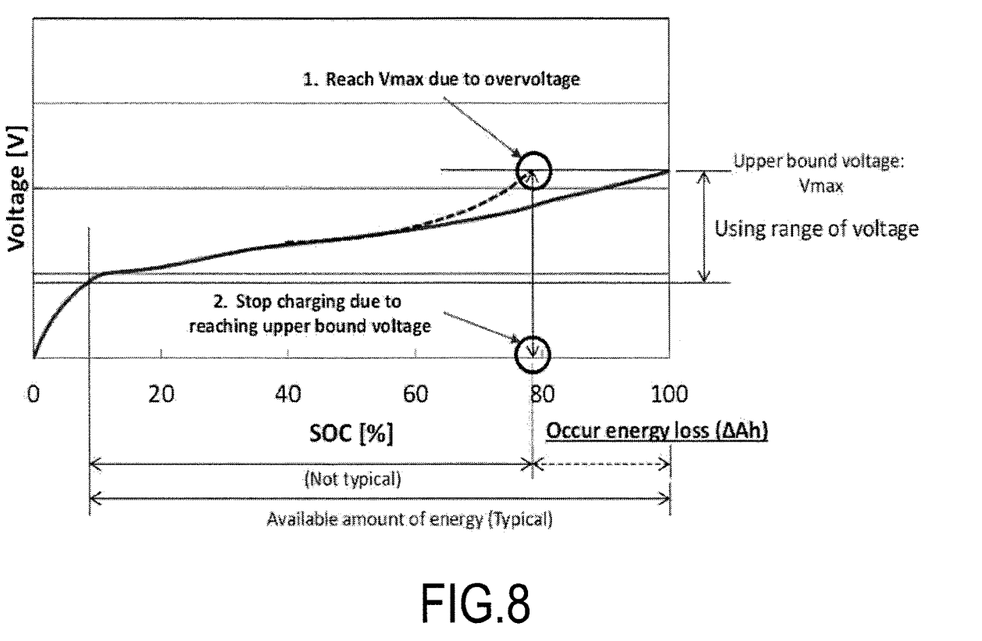
FIG. 8 shows an exemplary and schematic voltage—SOC diagram of a battery, when a conventional charging control is applied.

FIG. 8 shows an exemplary and schematic voltage—SOC diagram of a battery, when a conventional charging control is applied. As it can be seen the voltage V of the battery increases during charging, i.e. it increases with an increasing SOC of the battery.

The continuous line thereby represents a battery without any degradation, e.g. a new battery. The measured voltage V of such a battery reaches during charging the upper voltage limit $V_{max}$, when the SOC reaches 100%. As an effect, it is correctly determined that charging is completed and charging is stopped.

The dashed line represents a battery with lamination degradation, e.g. a used battery. The measured voltage V of such a battery increases more strongly during charging due to the higher resistance caused by the lamination degradation. The voltage V therefore reaches already the upper voltage limit $V_{max}$, when the SOC is about 80%. As an effect, it is erroneously determined that charging is completed and charging is stopped. This can be avoided by the present disclosure as described in context of FIG. 9.

Figure 9:
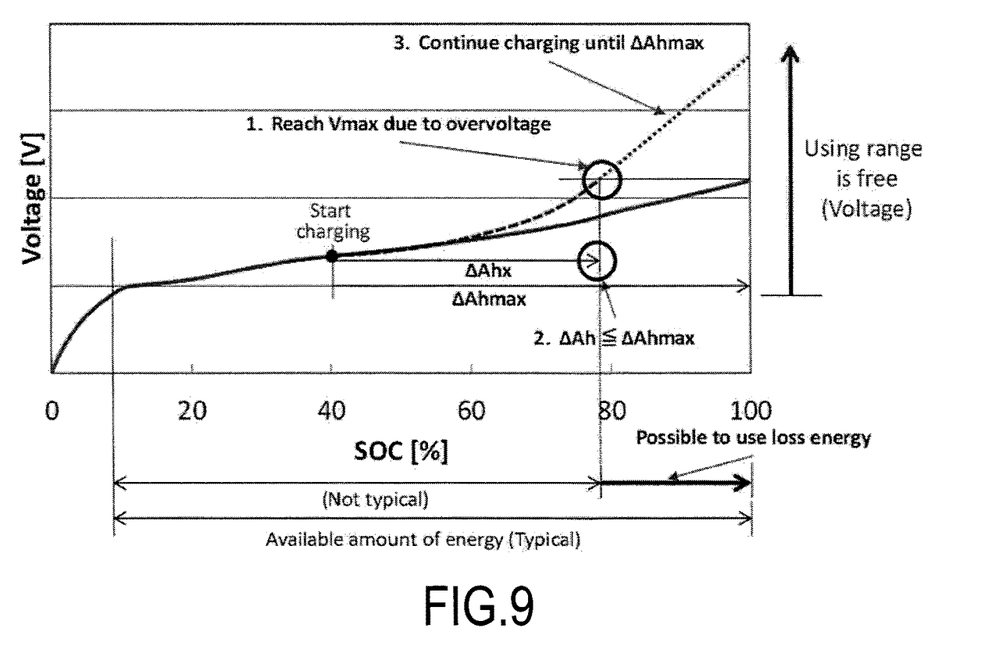
FIG. 9 shows an exemplary and schematic voltage—SOC diagram of a battery, when a charging control according to an embodiment of the present disclosure is applied.

FIG. 9 shows an exemplary and schematic voltage—SOC diagram of a battery, when a charging control according to an embodiment of the present disclosure is applied. FIG. 9 illustrates the same case as FIG. 8, i.e. a (new) battery without any degradation and a (used) battery having a lamination degradation. Both curves increase until they reach the initial upper voltage limit $V_{max}$. The dashed line representing a battery with lamination degradation thereby reaches the initial upper voltage limit $V_{max}$, when the SOC is about 80%.

However, according to the disclosure, charging is controlled based on the capacity of the battery and not based on the voltage V of the battery. Hence, charging is not stopped, when the voltage of the battery exceeds $V_{max}$. Instead, charging is continued until current capacity increment $\Delta Ah_x$ exceeds the determined maximum capacity increment $\Delta Ah_{max}$ and is only stopped at this time.

For this purpose the maximum capacity increment $\Delta Ah_{max}$ is determined, before charging is started, and during charging the current capacity increment $\Delta Ah_x$ is continuously monitored. In the present example charging is started at a $SOC_b$ of 40%. Hence, the determined maximum capacity increment $\Delta Ah_{max}$ corresponds to the remaining 60% SOC. When charging is started and the voltage of the battery exceeds $V_{max}$ at 80% SOC, the current capacity increment $\Delta Ah_x$ does not yet exceed the determined maximum capacity increment $\Delta Ah_{max}$. Hence, charging is continued.

In case it is detected during the charging process that the battery is discharged at the same time, the maximum capacity increment $\Delta Ah_{max}$ is re-determined. Accordingly, in the example of FIG. 9, if the battery is discharged e.g. by 5%, the maximum capacity increment $\Delta Ah_{max}$ may be re-determined, in order to add these lost 5%. At the same time, any further degradation may be anticipated, when re-determining $\Delta Ah_{max}$.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. A control device for controlling charging of a rechargeable battery of a vehicle, comprising:
   a rechargeable dummy cell configured to only support controlling charging of the rechargeable battery of the vehicle, the rechargeable dummy cell being a component that is separate and apart from the rechargeable battery;
   a first circuit configured to charge the rechargeable battery and the dummy cell; and
   a second circuit configured to measure the open circuit voltage of the dummy cell,
   the control device being configured to:
      determine an open circuit voltage of the dummy cell by using the second circuit;
      determine a maximum capacity increment of the rechargeable battery based on the determined open circuit voltage of the dummy cell;
      charge the rechargeable battery and the dummy cell by using the first circuit;
      monitor a current capacity increment of the rechargeable battery which has been charged; and
      stop charging, when the current capacity increment of the rechargeable battery exceeds the determined maximum capacity increment,
      wherein the determined maximum capacity increment is an amount of capacity that still remains to be charged until the state of charge of the rechargeable battery reaches 100%.

2. The control device according to claim 1, wherein the control device is further configured to:
   determine, whether the rechargeable battery is discharged during charging, and,
   if yes, re-determine the open circuit voltage of the dummy cell and the maximum capacity increment of the rechargeable battery.

3. The control device according to claim 1, wherein the control device is further configured to:
   determine the current capacity increment of the rechargeable battery based on at least one of: (i) the charging current and the charging time of the rechargeable battery; and (ii) the open circuit voltage of the dummy cell.

4. The control device according to claim 1, wherein the control device is further configured to:
   determine the state of charge (SOC) of the dummy cell based on the determined open circuit voltage (OCV) of the dummy cell, the state of charge being determined from a predetermined SOC-OCV mapping, and
   determine the maximum capacity increment based on the determined state of charge of the dummy cell.

5. The control device according to claim 4, wherein the control device is further configured to:
   update the predetermined SOC-OCV mapping based on a determined degradation of the dummy cell.

6. The control device according to claim 5, wherein the control device is further configured to:
   determine the degradation of the dummy cell based on a temperature/frequency distribution of the dummy cell and a predetermined degradation rate of the dummy cell.

7. The control device according to claim 5, wherein
   the determination of the degradation of the dummy cell is based on the Arrhenius equation.

8. The control device according to claim 5, wherein the control device is further configured to:
   determine the temperature/frequency distribution of the dummy cell by recording for each temperature of the dummy cell how much time the dummy cell had this temperature during its lifetime.

9. The control device according to claim 4, wherein the control device is further configured to:
   determine the state of charge of the rechargeable battery based on a predetermined mapping between the state of charge of the rechargeable battery and the determined state of charge of the dummy cell, and
   determine the maximum capacity increment based on the state of charge of the rechargeable battery.

10. The control device according to claim 1, wherein the control device is further configured to:
    control charging of a battery of a specific battery type comprising a predetermined degradation rate,
    wherein the dummy cell has a degradation rate which correlates with the degradation rate of the rechargeable battery.

11. The control device according to claim 1,
    wherein the rechargeable battery of the specific battery type comprises a predetermined capacity, and
    wherein the dummy cell has a capacity which correlates with the capacity of the rechargeable battery.

12. The control device according to claim 1, further comprising:
    a voltage sensor for detecting the open circuit voltage of the dummy cell.

13. The control device according to claim 1, further comprising:
    a temperature sensor for detecting the temperature of at least one of: (i) the dummy cell; and (ii) the rechargeable battery.

14. A battery pack comprising:
    at least one battery, and
    a control device according to claim 1.

15. A vehicle comprising:
    an electric motor, and
    a battery pack according to claim 14.

16. A battery charging system comprising:
    at least one battery,
    a charging device for the at least one battery, and
    a control device according to claim 1.

17. A vehicle comprising:
an electric motor,
at least one battery, and
a control device according to claim 1.

18. The control device according to claim 1, wherein the dummy cell and the rechargeable battery are a same type of battery.

19. A method of controlling charging of a rechargeable battery of a vehicle, wherein a first circuit is used to charge the rechargeable battery and a rechargeable dummy cell, the rechargeable dummy cell being configured to only support controlling charging of the rechargeable battery of the vehicle, and being a component that is separate and apart from the rechargeable battery, and a second circuit is used to measure an open circuit voltage of the dummy cell, the method comprising:
 determining the open circuit voltage of the dummy cell by using the second circuit;
 determining a maximum capacity increment of the rechargeable battery based on the determined open circuit voltage of the dummy cell;
 charging the rechargeable battery and the dummy cell by using the first circuit;
 monitoring a current capacity increment of the rechargeable battery which has been charged; and
 stopping charging, when the current capacity increment of the rechargeable battery exceeds the determined maximum capacity increment,
wherein the maximum capacity increment is an amount of capacity that still remains to be charged until the state of charge of the rechargeable battery reaches 100%.

20. The method according to claim 19, further comprising:
 determining, whether the rechargeable battery is discharged during charging, and,
 if yes, re-determining the open circuit voltage of the dummy cell and the maximum capacity increment.

21. The method according to claim 19, wherein the current capacity increment of the rechargeable battery is determined based on at least one of: (i) the charging current and the charging time of the rechargeable battery; and (ii) the open circuit voltage of the dummy cell.

22. The method according to claim 19, wherein the state of charge (SOC) of the dummy cell is determined based on the determined open circuit voltage (OCV) of the dummy cell, the state of charge being determined from a predetermined SOC-OCV mapping, and
 the maximum capacity increment is determined based on the determined state of charge of the dummy cell.

23. The method according to claim 22, wherein the predetermined SOC-OCV mapping is updated based on a determined degradation of the dummy cell.

24. The method according to claim 23, wherein the degradation of the rechargeable battery is determined based on a temperature/frequency distribution of the dummy cell and a predetermined degradation rate of the dummy cell.

25. The method according to claim 24, wherein the temperature/frequency distribution of the dummy cell is determined by recording for each temperature of the dummy cell how much time the dummy cell had this temperature during its lifetime.

26. The method according to claim 23, wherein the determination of the degradation of the dummy cell is based on the Arrhenius equation.

27. The method according to claim 22, wherein the state of charge of the rechargeable battery is determined based on a predetermined mapping between the state of charge of the rechargeable battery and the determined state of charge of the dummy cell, and
 the maximum capacity increment is determined based on the state of charge of the rechargeable battery.

28. The method according to claim 19, wherein the dummy cell and the rechargeable battery are a same type of battery.

* * * * *